(12) United States Patent
Kent et al.

(10) Patent No.: US 12,093,663 B1
(45) Date of Patent: Sep. 17, 2024

(54) SYSTEM AND METHODS FOR CONSTRUCTING SINGLE-STAGE N-SORTERS AND N-FILTERS

(71) Applicant: UNM Rainforest Innovations, Albuquerque, NM (US)

(72) Inventors: Robert Bernard Kent, Albuquerque, NM (US); Marios Stephanou Pattichis, Albuquerque, NM (US)

(73) Assignee: UNM RAINFOREST INNOVATIONS, Albuquerque, NM (US)

( * ) Notice: Subject to any disclaimer, the term of this patent is extended or adjusted under 35 U.S.C. 154(b) by 0 days.

(21) Appl. No.: 18/532,546

(22) Filed: Dec. 7, 2023

Related U.S. Application Data

(60) Provisional application No. 63/386,517, filed on Dec. 8, 2022.

(51) Int. Cl.
  G06F 7/24    (2006.01)
  G06F 7/02    (2006.01)
  G06F 7/544   (2006.01)
  H03K 19/20   (2006.01)

(52) U.S. Cl.
  CPC .......... *G06F 7/24* (2013.01); *G06F 7/02* (2013.01); *G06F 7/5443* (2013.01); *H03K 19/20* (2013.01)

(58) Field of Classification Search
  CPC ........... G06F 7/24; G06F 7/02; G06F 7/5443; H03K 19/20
  USPC ............................................. 708/200
  See application file for complete search history.

(56) References Cited

U.S. PATENT DOCUMENTS

| | | | |
|---|---|---|---|
| 11,360,740 B1 * | 6/2022 | Kent | G06F 7/24 |
| 11,693,623 B1 * | 7/2023 | Kent | G06F 7/16 708/446 |

OTHER PUBLICATIONS

Kent et al, Design, Implementation, and Analysis of High-Speed Single-Stage N-Sorters and N-Filters published Dec. 25, 2020 in IEEE Access, vol. 9, 2021, pp. 2576-2591. (Year: 2021).*

* cited by examiner

*Primary Examiner* — Tan V Mai
(74) *Attorney, Agent, or Firm* — Valauskas Corder LLC

(57) ABSTRACT

A system and methods for using carry chain logic, a product term splitting methodology, and a new Sum-of-Products (SOP) output multiplexer (mux) equation to build faster and larger sorting blocks.

20 Claims, 15 Drawing Sheets

```
wire   In_6_goes_to_Out_5 =

(   ge_6_5 &&    ge_6_4 &&    ge_6_3 &&    ge_6_2 &&    ge_6_1 && ! ge_6_0  ) ||
(   ge_6_5 &&    ge_6_4 &&    ge_6_3 &&    ge_6_2 && !  ge_6_1 &&   ge_6_0  ) ||
(   ge_6_5 &&    ge_6_4 &&    ge_6_3 && !  ge_6_2 &&    ge_6_1 &&   ge_6_0  ) ||
(   ge_6_5 &&    ge_6_4 && !  ge_6_3 &&    ge_6_2 &&    ge_6_1 &&   ge_6_0  ) ||
(   ge_6_5 && !  ge_6_4 &&    ge_6_3 &&    ge_6_2 &&    ge_6_1 &&   ge_6_0  ) ||
( ! ge_6_5 &&    ge_6_4 &&    ge_6_3 &&    ge_6_2 &&    ge_6_1 &&   ge_6_0  )  ;
```

```
assign  Out_5[ 0 ]
    =
        ( In_6_goes_to_Out_5 ? In_6[ 0 ] :
        ( In_5_goes_to_Out_5 ? In_5[ 0 ] :
        ( In_4_goes_to_Out_5 ? In_4[ 0 ] :
        ( In_3_goes_to_Out_5 ? In_3[ 0 ] :
        ( In_2_goes_to_Out_5 ? In_2[ 0 ] :
        ( In_1_goes_to_Out_5 ? In_1[ 0 ] :
                              In_0[ 0 ]  ) ) ) ) ) ) ;
```

FIG. 5

```
assign  Out_5[ 0 ]
    =
        ( In_6_goes_to_Out_5 && In_6[ 0 ] ) ||
        ( In_5_goes_to_Out_5 && In_5[ 0 ] ) ||
        ( In_4_goes_to_Out_5 && In_4[ 0 ] ) ||
        ( In_3_goes_to_Out_5 && In_3[ 0 ] ) ||
        ( In_2_goes_to_Out_5 && In_2[ 0 ] ) ||
        ( In_1_goes_to_Out_5 && In_1[ 0 ] ) ||
        ( In_0_goes_to_Out_5 && In_0[ 0 ] )     ;
```

FIG. 6

|  |  | Inputs | Outputs |
|---|---|---|---|
| [ 7 ] | S | 1 | CO |
|  | DI | 0 |  |
| [ 6 ] | S | 1 | CO |
|  | DI | 0 |  |
| [ 5 ] | S | ! In_6_goes_to_Out_5 | Out_5[ 0 ] CO |
|  | DI | In_6[ 0 ] |  |
| [ 4 ] | S | ! In_5_goes_to_Out_5 | CO |
|  | DI | In_5[ 0 ] |  |

CI[ 4 ] = CO[ 3 ]

|  |  | Inputs | Outputs |
|---|---|---|---|
| [ 3 ] | S | ! In_4_goes_to_Out_5 | CO |
|  | DI | In_4[ 0 ] |  |
| [ 2 ] | S | ! In_3_goes_to_Out_5 | CO |
|  | DI | In_3[ 0 ] |  |
| [ 1 ] | S | ! In_2_goes_to_Out_5 | CO |
|  | DI | In_2[ 0 ] |  |
| [ 0 ] | S | ! In_1_goes_to_Out_5 | CO |
|  | DI | In_1[ 0 ] |  |

CI[ 0 ] = CI_BOTTOM = In_0[ 0 ]

FIG. 10

| | Inputs | Outputs | |
|---|---|---|---|
| [7] | S  ! ( ( In_9_goes_to_Out_Y && In_9[ 1 ] )       ) | Out_Y[1] | CO |
| | DI             1 | | |
| [6] | S  ! ( ( In_8_goes_to_Out_Y && In_8[ 1 ] ) \|\|<br>     ( In_7_goes_to_Out_Y && In_7[ 1 ] ) \|\|<br>     ( In_6_goes_to_Out_Y && In_6[ 1 ] )    ) | | CO |
| | DI             1 | | |
| [5] | S  ! ( ( In_5_goes_to_Out_Y && In_5[ 1 ] ) \|\|<br>     ( In_4_goes_to_Out_Y && In_4[ 1 ] ) \|\|<br>     ( In_3_goes_to_Out_Y && In_3[ 1 ] )    ) | | CO |
| | DI             1 | | |
| [4] | S  ! ( ( In_2_goes_to_Out_Y && In_2[ 1 ] ) \|\|<br>     ( In_1_goes_to_Out_Y && In_1[ 1 ] ) \|\|<br>     ( In_0_goes_to_Out_Y && In_0[ 1 ] )    ) | | CO |
| | DI             1 | | |
| | CI[ 4 ] = CI_TOP = 0 | | |
| [3] | S  ! ( ( In_9_goes_to_Out_Y && In_9[ 0 ] )       ) | Out_Y[0] | CO |
| | DI             1 | | |
| [2] | S  ! ( ( In_8_goes_to_Out_Y && In_8[ 0 ] ) \|\|<br>     ( In_7_goes_to_Out_Y && In_7[ 0 ] ) \|\|<br>     ( In_6_goes_to_Out_Y && In_6[ 0 ] )    ) | | CO |
| | DI             1 | | |
| [1] | S  ! ( ( In_5_goes_to_Out_Y && In_5[ 0 ] ) \|\|<br>     ( In_4_goes_to_Out_Y && In_4[ 0 ] ) \|\|<br>     ( In_3_goes_to_Out_Y && In_3[ 0 ] )    ) | | CO |
| | DI             1 | | |
| [0] | S  ! ( ( In_2_goes_to_Out_Y && In_2[ 0 ] ) \|\|<br>     ( In_1_goes_to_Out_Y && In_1[ 0 ] ) \|\|<br>     ( In_0_goes_to_Out_Y && In_0[ 0 ] )    ) | | CO |
| | DI             1 | | |
| | CI[ 0 ] = CI_BOTTOM = 0 | | |

FIG. 11

| Segment | | Inputs | Outputs | |
|---|---|---|---|---|
| [7] | S | ! ( ( In_15_to_Out_8_A[ 0 ] && In_15_to_Out_8_B[ 8 ] ) \|\|<br>( In_15_to_Out_8_A[ 1 ] && In_15_to_Out_8_B[ 7 ] )  ) | Out_8[0] | CO |
|  | DI | In_15[ 0 ] | | |
| [6] | S | ! ( ( In_15_to_Out_8_A[ 2 ] && In_15_to_Out_8_B[ 6 ] ) \|\|<br>( In_15_to_Out_8_A[ 3 ] && In_15_to_Out_8_B[ 5 ] ) \|\|<br>( In_15_to_Out_8_A[ 4 ] && In_15_to_Out_8_B[ 4 ] )  ) | | CO |
|  | DI | In_15[ 0 ] | | |
| [5] | S | ! ( ( In_15_to_Out_8_A[ 5 ] && In_15_to_Out_8_B[ 3 ] ) \|\|<br>( In_15_to_Out_8_A[ 6 ] && In_15_to_Out_8_B[ 2 ] ) \|\|<br>( In_15_to_Out_8_A[ 7 ] && In_15_to_Out_8_B[ 1 ] )  ) | | CO |
|  | DI | In_15[ 0 ] | | |
| [4] | S | ! ( ( In_14_to_Out_8_A[ 0 ] && In_14_to_Out_8_B[ 8 ] ) \|\|<br>( In_14_to_Out_8_A[ 1 ] && In_14_to_Out_8_B[ 7 ] )  ) | | CO |
|  | DI | In_14[ 0 ] | | |
| | | CI[ 4 ] = CO[ 3 ] | | |
| [3] | S | ! ( ( In_14_to_Out_8_A[ 2 ] && In_14_to_Out_8_B[ 6 ] ) \|\|<br>( In_14_to_Out_8_A[ 3 ] && In_14_to_Out_8_B[ 5 ] ) \|\|<br>( In_14_to_Out_8_A[ 4 ] && In_14_to_Out_8_B[ 4 ] )  ) | | CO |
|  | DI | In_14[ 0 ] | | |
| [2] | S | ! ( ( In_14_to_Out_8_A[ 5 ] && In_14_to_Out_8_B[ 3 ] ) \|\|<br>( In_14_to_Out_8_A[ 6 ] && In_14_to_Out_8_B[ 2 ] ) \|\|<br>( In_14_to_Out_8_A[ 7 ] && In_14_to_Out_8_B[ 1 ] )  ) | | CO |
|  | DI | In_14[ 0 ] | | |
| [1] | S | ! ( ( In_13_to_Out_8_A[ 0 ] && In_13_to_Out_8_B[ 8 ] ) \|\|<br>( In_13_to_Out_8_A[ 1 ] && In_13_to_Out_8_B[ 7 ] )  ) | | CO |
|  | DI | In_13[ 0 ] | | |
| [0] | S | ! ( ( In_13_to_Out_8_A[ 2 ] && In_13_to_Out_8_B[ 6 ] ) \|\|<br>( In_13_to_Out_8_A[ 3 ] && In_13_to_Out_8_B[ 5 ] ) \|\|<br>( In_13_to_Out_8_A[ 4 ] && In_13_to_Out_8_B[ 4 ] )  ) | | CO |
|  | DI | In_13[ 0 ] | | |
| | | CI[ 0 ] = CI_BELOW | | |

FIG. 12

| N-sorter | N-1 | Number in A Group | Number in B Group | Max MUX Product Terms per Input | Max MUX LUTs per Input | Max MUX LUTs per Bit |
|---|---|---|---|---|---|---|
| 8 | 7 | 2 | 5 | 3 | 1 | 7 |
| 9 | 8 | 2 | 6 | 3 | 1 | 8 |
| 10 | 9 | 4 | 5 | 5 | 2 | 18 |
| 12 | 11 | 5 | 6 | 6 | 2 | 22 |
| 16 | 15 | 7 | 8 | 8 | 3 | 45 |
| 19 | 18 | 9 | 9 | 10 | 4 | 72 |

The last 3 columns refer to the output bit multiplexer product terms.
The prior 3 columns refer to the splitting of the In_X_goes_to_Out_Y product terms.

FIG. 13

| Segment | Inputs | Outputs | |
|---|---|---|---|
| [7] | S ! ( ( In_8_A_counts[ 0 ] && In_8_B_counts[ 4 ] ) \|\|<br>( In_8_A_counts[ 1 ] && In_8_B_counts[ 3 ] ) \|\|<br>( In_8_A_counts[ 2 ] && In_8_B_counts[ 2 ] ) )<br>DI In_8[ 0 ] | Out_4[0] | CO |
| [6] | S ! ( ( In_7_A_counts[ 0 ] && In_7_B_counts[ 4 ] ) \|\|<br>( In_7_A_counts[ 1 ] && In_7_B_counts[ 3 ] ) \|\|<br>( In_7_A_counts[ 2 ] && In_7_B_counts[ 2 ] ) )<br>DI In_7[ 0 ] | | CO |
| [5] | S ! ( ( In_6_A_counts[ 0 ] && In_6_B_counts[ 4 ] ) \|\|<br>( In_6_A_counts[ 1 ] && In_6_B_counts[ 3 ] ) \|\|<br>( In_6_A_counts[ 2 ] && In_6_B_counts[ 2 ] ) )<br>DI In_6[ 0 ] | | CO |
| [4] | S ! ( ( In_5_A_counts[ 0 ] && In_5_B_counts[ 4 ] ) \|\|<br>( In_5_A_counts[ 1 ] && In_5_B_counts[ 3 ] ) \|\|<br>( In_5_A_counts[ 2 ] && In_5_B_counts[ 2 ] ) )<br>DI In_5[ 0 ] | | CO |
| | CI[ 4 ] = CO[ 3 ] | | |
| [3] | S ! ( ( In_4_A_counts[ 0 ] && In_4_B_counts[ 4 ] ) \|\|<br>( In_4_A_counts[ 1 ] && In_4_B_counts[ 3 ] ) \|\|<br>( In_4_A_counts[ 2 ] && In_4_B_counts[ 2 ] ) )<br>DI In_4[ 0 ] | | CO |
| [2] | S ! ( ( In_3_A_counts[ 0 ] && In_3_B_counts[ 4 ] ) \|\|<br>( In_3_A_counts[ 1 ] && In_3_B_counts[ 3 ] ) \|\|<br>( In_3_A_counts[ 2 ] && In_3_B_counts[ 2 ] ) )<br>DI In_3[ 0 ] | | CO |
| [1] | S ! ( ( In_2_A_counts[ 0 ] && In_2_B_counts[ 4 ] ) \|\|<br>( In_2_A_counts[ 1 ] && In_2_B_counts[ 3 ] ) \|\|<br>( In_2_A_counts[ 2 ] && In_2_B_counts[ 2 ] ) )<br>DI In_2[ 0 ] | | CO |
| [0] | S ! ( ( In_1_A_counts[ 0 ] && In_1_B_counts[ 4 ] ) \|\|<br>( In_1_A_counts[ 1 ] && In_1_B_counts[ 3 ] ) \|\|<br>( In_1_A_counts[ 2 ] && In_1_B_counts[ 2 ] ) )<br>DI In_1[ 0 ] | | CO |
| | CI[ 0 ] = CI_BOTTOM = In_0[ 0 ] | | |

FIG. 14

| segment | inputs | outputs |
|---|---|---|
| [7] S | 1 | CO |
| OI | 0 | |
| [6] S | 1 | CO |
| OI | 0 | |
| [5] S ! ( <br>     ( In_11_A_counts[5] && In_11_B_counts[6] && In_11[0] ) \|\| <br>     ( In_10_A_counts[5] && In_10_B_counts[6] && In_10[0] )   ) | | out_11[0]   CO |
| OI | 1 | |
| [4] S ! ( <br>     ( In_9_A_counts[5] && In_9_B_counts[6] && In_9[0] ) \|\| <br>     ( In_8_A_counts[5] && In_8_B_counts[6] && In_8[0] )   ) | | CO |
| OI | 1 | |

CI[ 4 ] = CO[ 3 ]

| | | |
|---|---|---|
| [3] S ! ( <br>     ( In_7_A_counts[5] && In_7_B_counts[6] && In_7[0] ) \|\| <br>     ( In_6_A_counts[5] && In_6_B_counts[6] && In_6[0] )   ) | | CO |
| OI | 1 | |
| [2] S ! ( <br>     ( In_5_A_counts[5] && In_5_B_counts[6] && In_5[0] ) \|\| <br>     ( In_4_A_counts[5] && In_4_B_counts[6] && In_4[0] )   ) | | CO |
| OI | 1 | |
| [1] S ! ( <br>     ( In_3_A_counts[5] && In_3_B_counts[6] && In_3[0] ) \|\| <br>     ( In_2_A_counts[5] && In_2_B_counts[6] && In_2[0] )   ) | | CO |
| OI | 1 | |
| [0] S ! ( <br>     ( In_1_A_counts[5] && In_1_B_counts[6] && In_1[0] ) \|\| <br>     ( In_0_A_counts[5] && In_0_B_counts[6] && In_0[0] )   ) | | CO |
| OI | 1 | |

CI[ 0 ] = CI_BOTTOM = 0

FIG. 15

|  | Inputs | Outputs |
|---|---|---|
| [7] S ! ( In_24_A_counts[6] && In_24_B_counts[6] && In_24_C_counts[6] && In_24_D_counts[6] ) | | Out_24[0]  CO |
| DI  In_24[ 0 ] | | |
| [6] S ! ( In_23_A_counts[6] && In_23_B_counts[6] && In_23_C_counts[6] && In_23_D_counts[6] ) | | CO |
| DI  In_23[ 0 ] | | |
| [5] S ! ( In_22_A_counts[6] && In_22_B_counts[6] && In_22_C_counts[6] && In_22_D_counts[6] ) | | CO |
| DI  In_22[ 0 ] | | |
| [4] S ! ( In_21_A_counts[6] && In_21_B_counts[6] && In_21_C_counts[6] && In_21_D_counts[6] ) | | CO |
| DI  In_21[ 0 ] | | |

CI[ 4 ] = CO[ 3 ]

| [3] S ! ( In_20_A_counts[6] && In_20_B_counts[6] && In_20_C_counts[6] && In_20_D_counts[6] ) | | CO |
|---|---|---|
| DI  In_20[ 0 ] | | |
| [2] S ! ( In_19_A_counts[6] && In_19_B_counts[6] && In_19_C_counts[6] && In_19_D_counts[6] ) | | CO |
| DI  In_19[ 0 ] | | |
| [1] S ! ( In_18_A_counts[6] && In_18_B_counts[6] && In_18_C_counts[6] && In_18_D_counts[6] ) | | CO |
| DI  In_18[ 0 ] | | |
| [0] S ! ( In_17_A_counts[6] && In_17_B_counts[6] && In_17_C_counts[6] && In_17_D_counts[6] ) | | CO |
| DI  In_17[ 0 ] | | |

CI[ 0 ] = CI_BELOW

FIG. 16

|  | Inputs | Outputs |
|---|---|---|
| [7] S ( | ge_124_27 && ge_124_26 && <br> ge_124_25 && ge_124_24 && <br> ge_124_23 && ge_124_22     ) | CO |
| DI | 0 | |
| [6] S ( | ge_124_21 && ge_124_20 && <br> ge_124_19 && ge_124_18 && <br> ge_124_17 && ge_124_16     ) | CO |
| DI | 0 | |
| [5] S ( | ge_124_15 && ge_124_14 && <br> ge_124_13 && ge_124_12 && <br> ge_124_11 && ge_124_10     ) | CO |
| DI | 0 | |
| [4] S ( | ge_124_9 && ge_124_8 && <br> ge_124_7 && ge_124_6 && <br> ge_124_5 && ge_124_4     ) | CO |
| DI | 0 | |

CI[ 4 ] = CO[ 3 ]

|  |  | |
|---|---|---|
| [3] S ( | ge_124_3 && ge_124_2 && <br> ge_124_1 && ge_124_0     ) | CO |
| DI | 0 | |
| [2] S | 1 | CO |
| DI | 0 | |
| [1] S | 1 | CO |
| DI | 0 | |
| [0] S | 1 | CO |
| DI | 0 | |

CI[ 0 ] = CI_BOTTOM = 1

FIG. 17

| N | Prior Art Baseline LUT-MUXF N-sorters | New SOP Output Mux LUT-MUXF N-sorters | New LUT-MUXCY Carry Chain N-sorters | Prior Art Baseline LUT-MUXF N-max Filters | New SOP Output Mux LUT-MUXF N-max Filters | New LUT-MUXCY Carry Chain N-max Filters |
|---|---|---|---|---|---|---|
| 4 | 3 | 3 | 2 | 3 | 3 | 2 |
| 5 | 3 | 3 | 2 | 3 | 3 | 2 |
| 6 | 3 | 3 | 2 | 3 | 3 | 2 |
| 7 | 4 | 4 | 2 | 3 | 4 | 2 |
| 8 | 4 | 4 | 3 | 3 | 4 | 3 |
| 9 | 4 | 4 | 3 | 3 | 4 | 3 |
| 10 | 4 | 4 | 3 | 3 | 4 | 3 |
| 12 | | | 3 | | 4 | 3 |
| 16 | | | 3 | | 4 | 3 |
| 25 | | | | | | 3 |
| 49 | | | | | | 3 |
| 125 | | | | | | 3 |

Shading is used to delineate groups with the same number of LBs in series.

SYSTEM AND METHODS FOR CONSTRUCTING SINGLE-STAGE N-SORTERS AND N-FILTERS

CROSS-REFERENCE TO RELATED APPLICATIONS

This application claims the benefit of U.S. Provisional Application No. 63/386,517, filed on Dec. 8, 2022, all of which is incorporated by reference.

FIELD OF THE INVENTION

The invention relates generally to sorting lists of values in hardware. More specifically, the invention relates to using single-stage hardware sorting blocks to sort the lists of values.

BACKGROUND OF THE INVENTION

Improved system and methods have been developed for designing single-stage hardware sorting blocks, and using the single-stage hardware sorting blocks to reduce the number of stages in multistage sorting processes, or to define multiway merge sorting networks, as described in U.S. Pat. No. 11,360,740 issued Jun. 14, 2022, as well as in the technical paper Design, Implementation, and Analysis of High-Speed Single-Stage N-Sorters and N-Filters published Dec. 25, 2020 in IEEE Access, Vol. 9, both incorporated by reference. As described, a single-stage N-sorter or N-filter has one set of input ports, one set of output ports, and whatever internal logic is needed in order to produce a fully sorted list of the input values at the output ports.

Prior to these improvements, the only fast and efficient single-stage N-sorters and N-filters that were available were 2-sorters and 2-max and 2-min filters. Sorting more than 2 input values required a multi-stage sorting network, in which 2-sorters and/or 2-filters were utilized in each stage of the sorting process. A block diagram showing the design and data flow for the previously disclosed N-sorters is shown FIG. 1. This prior art methodology for designing single-stage N-sorters includes these characteristics:

N unordered input values are processed into a fully sorted output list.

Each of the N input values is transferred to a specific location in the list of N sorted outputs. There are N*(N−1)/2 comparison signals created in order to correctly sort the input list.

The inputs are identified as inputs In_(N−1) down to input In_0, and the outputs are identified as outputs Out_(N−1) down to output Out_0.

The output list sorted order is uniformly non-increasing from output Out_(N−1) down to output Out_0.

For each input X, In_X_goes_to_Out_Y signals are defined, and an input's one true In_X_goes_to_Out_Y signal uniquely maps that In_X input to a specific Out_Y output in the sorted output list. The In_X_goes_to_Out_Y signals are defined for all inputs except In_0.

The In_X_goes_to_Out_Y signals are defined as Sum-of-Products equations. Each SOP product term contains N−1 comparison state variables, the results of the comparisons of In_X to all N−1 other inputs.

All of an input's product terms containing I "winners" are grouped into the appropriate In_X_goes_to_Out_Y SOP equation. A winner occurs for a given input when it is on the left side of the >=comparison operator and the comparison is true, or it is on the right side of the >=operator and the comparison result is false.

The system of In_X_goes_to_Out_Y signals, and their use in output bit multiplexers, ultimately implements a comparison counting sort process. The comparison counting is performed in a combinatorial process by triggering a product term, one product term per input, in an In_X_goes_to_Out_Y SOP equation. Synchronous counters are not needed.

The mapping of a unique input to a target output is implemented in the output bit muxes constructed for that output. An output bit multiplexer is designed using an equation which utilizes ternary, i.e., conditional syntax.

The N-sorter sorting process produces a stable sort. In the sorted output list, equal input values are presented in the same order that they are found in the input list.

The general N-sorter design methodology is not itself hardware-specific. However, previous disclosures typically used a specific hardware type in order to explain how the methodology is used to produce fast and efficient N-sorters and N-filters. This specific hardware is a vendor-supplied logic block (LB) which contains a number of Look-Up-Tables (LUTs), and 2-to-1 MUXF* multiplexers which can be used to combine the outputs of 2 or more LUTs. An example of this type of LUT-MUXF* logic block, with 8 6-input LUTs and 3 levels of MUXF7/F8/F9 2-to-1 multiplexers, is shown in FIG. 2.

The "slice" LB in the Xilinx Ultrascale and Ultrascale+ FPGA families can be configured to produce the FIG. 2 LUT-MUXF7/F8/F9 logic block. The slice LB in the earlier Xilinx 7-Series FPGAs can be configured in a similar manner. However, each of the 7-Series slice LBs has only 4 6-input LUTs, so the corresponding 7-series LUT-MUXF* logic block is a LUT-MUXF7/F8 block, with no available MUXF9 multiplexer. The MUXF7/F8/F9 nomenclature corresponds to that used by Xilinx.

FIG. 3. shows the In_6_goes_to_Out_5 SOP equation for a 7-sorter. The equation uses SystemVerilog syntax, which is used for all equations in the figures. Each product term in the equation contains the inverted or non-inverted state of the 6 signals produced when In_6 is compared see if it is to each of the other inputs. For In_6, each non-inverted state is a winner, and each product term in the FIG. 3 SOP equation has 5 winners.

If one of the product terms in this equation is true, the full SOP equation is true, and the input value at the In_6 port is then written to output port Out_5. In this case, note that no other In_6_goes_to_Out_Y signal will be true. Also, none of the other 6 inputs will have an In_X_goes_to_Out_5 signal that is true.

Single-stage N-filters are similar to N-sorters, except that only a subset of the sorted outputs are produced. Examples of N-filters include single-output N-max, N-min, and N-median filters. N-filters can produce more than 1 output, such as a lowest 2-of-5 filter. All N*(N−1)/2 comparison signals must still be created, even for a single output filter. However, only the In_X_goes_to_Out_Y signals need to be created for those Y outputs which are in the filter's sorted output list.

The N-max and N-min filter In_X_goes_to_Out_Y SOP equations are unique, as each contains only one product term. This feature often allows designs for these two filters to be significantly faster than the analogous full N-sorter, when using the LUT-MUXF* logic block.

What is needed is a system and methods for designing even faster and larger sorting blocks to reduce the number of stages in multistage sorting processes, or to define multiway merge sorting networks. The invention satisfies this need.

SUMMARY OF THE INVENTION

The invention is directed to a system and methods which use another hardware type, carry chain logic, to build even faster single-stage sorting blocks. Additional embodiments disclose a product term splitting methodology, and a new Sum-of-Products (SOP) output multiplexer (mux) equation, which are additions to the general design system. These two general design system additions can be used to build faster and larger sorting blocks, using both the original example hardware type and the new example hardware type, carry chain logic.

The single-stage N-sorter and N-filter embodiments disclosed here are still based on the comparison result counting design system defined in the documents listed above, and summarized in the background section. The FIG. 1 flow diagram is still generally valid for the embodiments disclosed here as well. There is no change to the 1st block in the diagram, the Comparison Signals Block at the upper left. The embodiments disclosed here target the final FIG. 1 block, the per-bit Output MUX block at the right. Because of the changes in the Output MUX block, there may be significant changes to the logic blocks in series between the 1st and final LBs.

One embodiment of the invention is directed to designing N-sorter and N-filter output bit multiplexers that uses carry chain logic hardware. Advantageously, single-stage N-sorters and N-filters which are constructed using vendor-supplied carry chain logic hardware. Hardware vendors, such as FPGA vendors, provide fast and efficient carry chain logic which the vendors' tools use for addition, subtraction, 2-value comparisons, and possibly other tasks. The provided carry chain logic must be fast, and often features carry lookahead acceleration internal to the carry chain hardware. One example of a provided carry chain logic block, and the block that will be targeted in this disclosure, is shown in FIG. 4 and is referred to as a LUT-MUXCY logic block.

As mentioned in the background section, In_X_goes_to_Out_Y signals are used in Out_Y bit multiplexers to map the correct In_X input to output Out_Y. Previously, full In_X_goes_to_Out_Y signals were created in a FIG. 2 LB, which supports general SOP equations with up to 9 inputs, the number of comparison state variables in the 10-sorter and 10-filter In_X_goes_to_Out_Y product terms. Therefore 10-sorters and 10-filters were the largest single-stage sorting blocks previously feasible.

A system for splitting In_X_goes_to_Out_Y product terms into 2 or more product term groups is disclosed here, and this product term splitting enables the design of single-stage N-sorters and N-filters larger than 10-sorters and 10-filters. When used with LUT-MUXCY carry chain logic hardware, product term splitting is used to construct significantly larger N-sorters and much larger N-max/N-min filters than were previously possible, while still minimizing the propagation delay of these larger sorters and filters. Product term splitting is also used to construct larger LUT-MUXF* N-max/N-min filters than those which were designed using the previous baseline system.

In addition to enabling design of larger sorting blocks, product term splitting can be used to design alternate versions of 10- and smaller N-sorters and N-filters. These alternate versions may be faster than the comparable sorting blocks which use full In_X_goes_to_Out_Y product terms.

Previously, one type of equation, using ternary or conditional syntax, was used to design an output bit multiplexer. An example of this equation type, for bit 0 of a 7-sorter's Out_5 port, is shown in FIG. 5. Although there are N=7 input bit [0]s which can go to Out_5[0], there are only (N−1)=6 In_X_goes_to_Out_5 signals needed in the equation. If none of the In_6_goes_to_Out_5 down to In_1_goes_to_Out_5 signals are true, then In_0[0] will go to Out_5[0]. This is in keeping with the prior art N-sorter design and behavior described in the background section. The reference [0] refers to bit 0.

Another embodiment is directed to a new Sum-of-Products output bit multiplexer equation, an example of which is shown in FIG. 6. This equation can be compared directly to that shown in FIG. 5, as both equations determine the value of a 7-sorter's Out_5 bit [0]. The FIG. 6 equation is a simple OR of N=7 product terms, one product term per input. When this equation is used, there is no default input, and the In_0_goes_to_Out_5 signal must be determined. The new multiplexer equation shown in FIG. 6 is an SOP equation, but it is not to be confused with the In_X_goes_to_Out_Y SOP equations, such as the one shown in FIG. 3. In additional embodiments, the equation in FIG. 6 is used to produce fast and efficient designs for several N-sorters and N-filters.

As mentioned above, FIG. 1 shows the data and design flow for the previously disclosed N-sorters which were designed using the FIG. 2 LB. FIG. 1 emphasizes that the propagation delay of an N-sorter is primarily dependent on the number of LBs that the slowest signals travel through in series. The slowest signals for the fastest N-sorters propagate through only 2 logic blocks in series. For the slowest N-sorters in this diagram, the longest signal paths travel through 4 LBs in series.

When signals travel through one or more levels of the 2-to-1 MUXF* multiplexers in the FIG. 2 LUT-MUXF* LB, these signals are slowed down, compared to signals that travel through only a single LUT in the logic block. However, the propagation delay for a signal traversing through the dedicated 2-to-1 mux connections and structures inside a FIG. 2 LB tends to be significantly smaller than the propagation delay as a signal travels through the interconnect that joins the outputs of one logic block to the inputs of the next logic block in series. In FPGAs, for example, a signal's path through the programmable interconnect routing between LBs is not finalized until place and route, and must compete with the interconnect routing of all signals in the design.

Unlike the other logic blocks shown in FIG. 1, the bottom left LB is outlined in dashed lines. This emphasizes that this logic block is not found in the new designs using the FIG. 4 carry chain logic. The longest signal paths for all of the carry chain logic N-sorters and N-filters disclosed here propagate through a maximum of 3 LBs in series, which tends to make the carry chain N-sorters and N-filters significantly faster than those which only use the FIG. 2 LUT=MUXF* LB.

The signal paths along a carry chain inside the FIG. 4 LB are designed for speed. As with the FIG. 2 2-to-1 multiplexer signals mentioned above, the carry chain paths are hard-wired within the LB, and they are also designed with lookahead acceleration. Longer carry chains are implemented with dedicated, hard-wired routing between vertically adjoining LBs, once again minimizing the propagation delay along the carry chain. In short, all of the internal carry chain paths are hard-wired, are determined at synthesis, and are not dependent on the general programmable interconnect, which is partitioned among competing signals at the later place and route implementation stages. The invention and its attributes and advantages will be further understood and appreciated with reference to the detailed description below of presently contemplated embodiments, taken in conjunction with the accompanying drawings.

DESCRIPTION OF DRAWINGS

The preferred embodiments of the invention will be described in conjunction with the appended drawings provided to illustrate and not to limit the invention.

FIG. 5 illustrates code for a 7-sorter Out_5[0] ternary bit multiplexer equation.

FIG. 6 illustrates code for a new 7-sorter Out_5[0] SOP bit multiplexer equation.

FIG. 10 illustrates a one 7-sorter output bit mux in an 8-segment LUT-MUXCY carry chain logic block.

FIG. 11 illustrates a two 10-sorter output bit muxes in an 8-segment LUT-MUXCY carry chain logic block.

FIG. 12 illustrates a 16-sorter Out_8 bit 0 mux setup with the top 8 of 48 segments in the 6th 6 LUT-MUXCY logic blocks.

FIG. 13 is a table of N-sorter A/B group sizes, output mux product terms, and output mux segment LUTs per bit.

FIG. 14 illustrates the 9-sorter median Out_4 bit [0] setup using A/B 2/6 product term groups.

FIG. 15 illustrates the 6-segment carry chain for 12-max bit [0] using A/B 5/6 groups.

FIG. 16 illustrates the top 8 of 24-segment 25-max bit [0] carry chain, using A/B/C/D 6/6/6/6 groups.

FIG. 17 illustrates the 125-max bottom 8 of 24-segments for In_124_goes_to_Out_124 mux select signal.

DETAILED DESCRIPTION

The invention is directed to a system and methods which use another hardware type, carry chain logic, to build even faster single-stage sorting blocks. Additional embodiments disclose a product term splitting methodology, and a new Sum-of-Products (SOP) output multiplexer (mux) equation, which are additions to the general design system. These two general design system additions can be used to build faster and larger sorting blocks, using both the original example hardware type and the new example hardware type, carry chain logic.

It is contemplated that any hardware which includes internal carry chain logic blocks can implement the carry chain logic design methodology according to the invention. However, hardware vendors such as FPGA vendors may implement carry chain logic structures in their hardware in different ways.

For the carry chain embodiments disclosed here, a specific hardware type is used as an example. Other hardware types are contemplated. The specific carry chain logic block used here for exemplary purposes is shown in FIG. 4, which is found in the Xilinx Ultrascale and Ultrascale+ products.

Figures 3, 4:
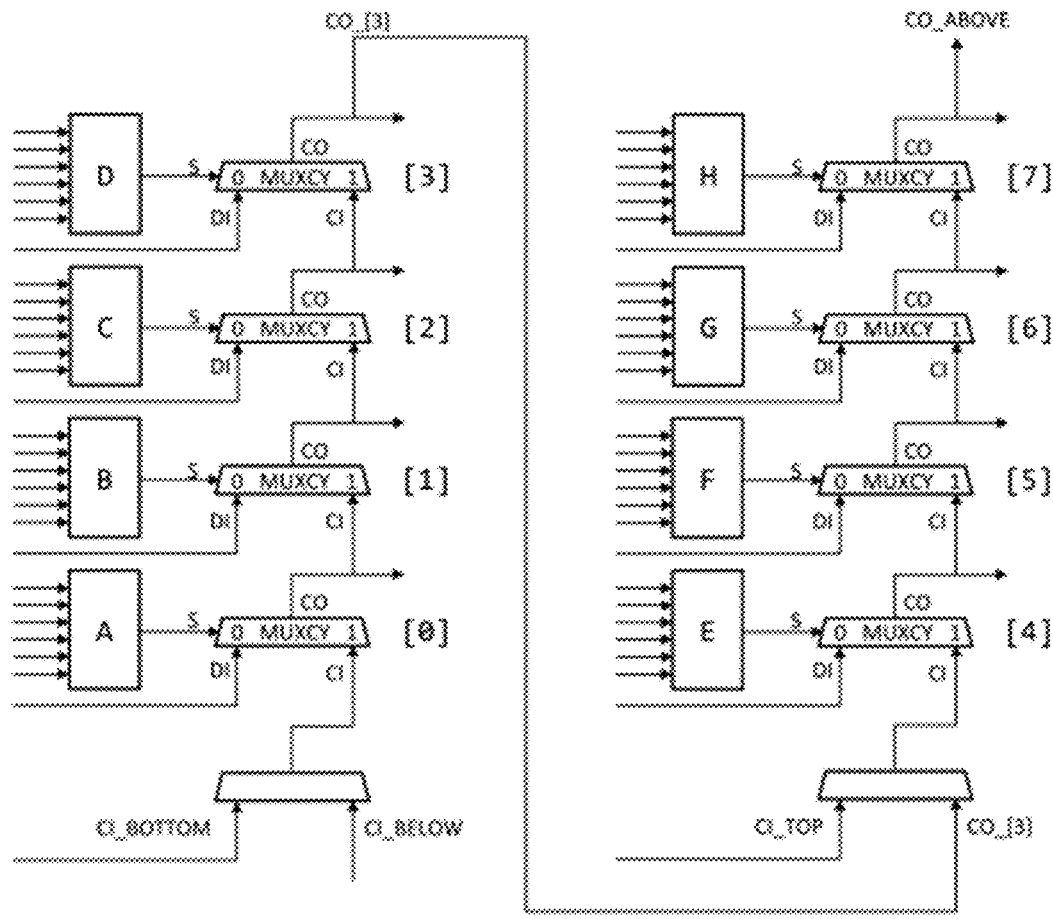
FIG. 3 illustrates code for a 7-sorter's In_6_goes_to_Out_5 SOP equation.
FIG. 4 illustrates a vendor-supplied prior art 8-segment LUT-MUXCY carry chain logic block.

As shown in FIG. 4, there are 8 carry chain segments. Each carry chain segment consists of a 6-input LUT, which produces the segment S (Select) input, a MUXCY 2-to-1 output multiplexer, additional DI (Data Input) and CI (Carry In) inputs, and a single CO (Carry Out) output. Xilinx calls its 8-LUT carry chain block a CARRY8 primitive. This 8-segment chain can be split into 2 independent 4-segment chains if desired. These 8-segment blocks can be cascaded into taller carry chains, by connecting the CO_ABOVE output signal from one 8-segment chain to the CI_BELOW signal of the 8-segment chain immediately above the 1st block.

In the full Xilinx CARRY8 block, there is an additional XOR structure found in each segment, which is used by Xilinx for all of its default additions and subtractions. This XOR is not utilized in the embodiments disclosed here, and is not shown in FIG. 4. Also, the DI input in the Xilinx CARRY8 can come from the 2nd O5 output in the segment LUT, which is used by Xilinx for 2-value comparisons, as well as additions and subtractions. For the carry chain designs disclosed here, the DI signal is always provided by an input from the interconnect.

Figure 2:
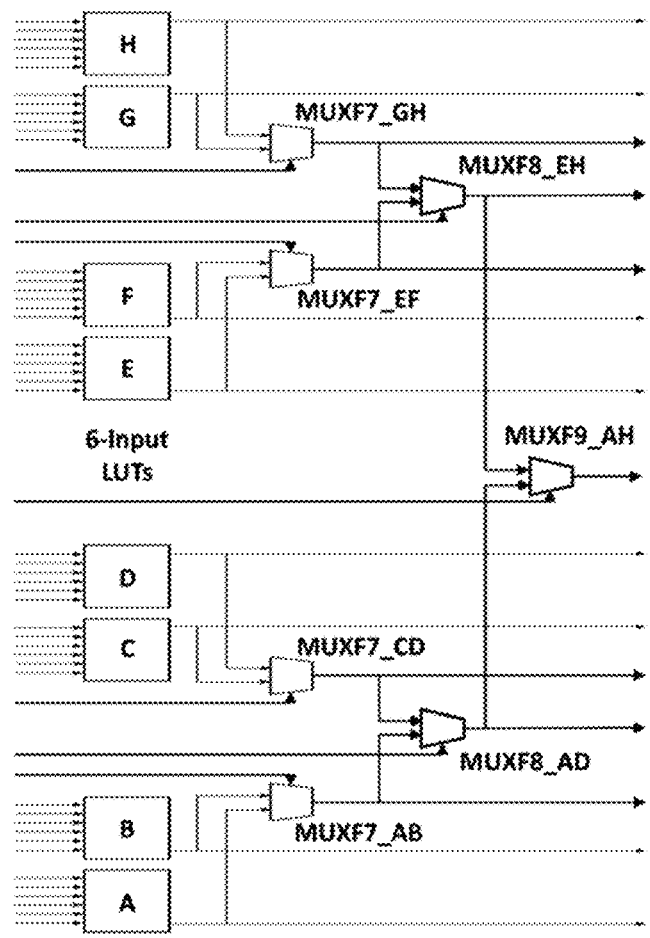
FIG. 2 illustrates a vendor-supplied prior art 8-LUT LUT-MUXF* logic block.

The LUT-MUXF* LB shown in FIG. 2 also has 8 6-input LUTs. In fact, the FIG. 4 and FIG. 2 blocks are just different configurations of the same 8-LUT logic block. While the FIG. 2 and FIG. 4 vendor-supplied logic blocks are known, they are used in a novel methodology to construct novel single-stage N-sorters and N-filters.

The earlier Xilinx 7-series products only provide a CARRY4 LB, with 4 carry chain segments. However, since these CARRY4 blocks can also be cascaded into taller carry chains, the Xilinx 7-series products will, in general, be able to implement the carry chain designs disclosed here.

As mentioned above, FIG. 6 is an example of the new N-sorter SOP output bit multiplexer equation disclosed here. Use of these equations is a fairly simple modification to the general single-stage N-sorter and N-filter design system previously disclosed. Their use is not hardware-specific.

Any hardware which can implement the previously disclosed single-stage sorters and filters can easily implement these new output bit multiplexers as well. For the sake of simplicity, the design examples disclosed here that use the FIG. 6 output multiplexer equation will also target either the original FIG. 2 LUT-MUXF* or the new FIG. 4 LUT-MUXCY logic block.

Figure 7:
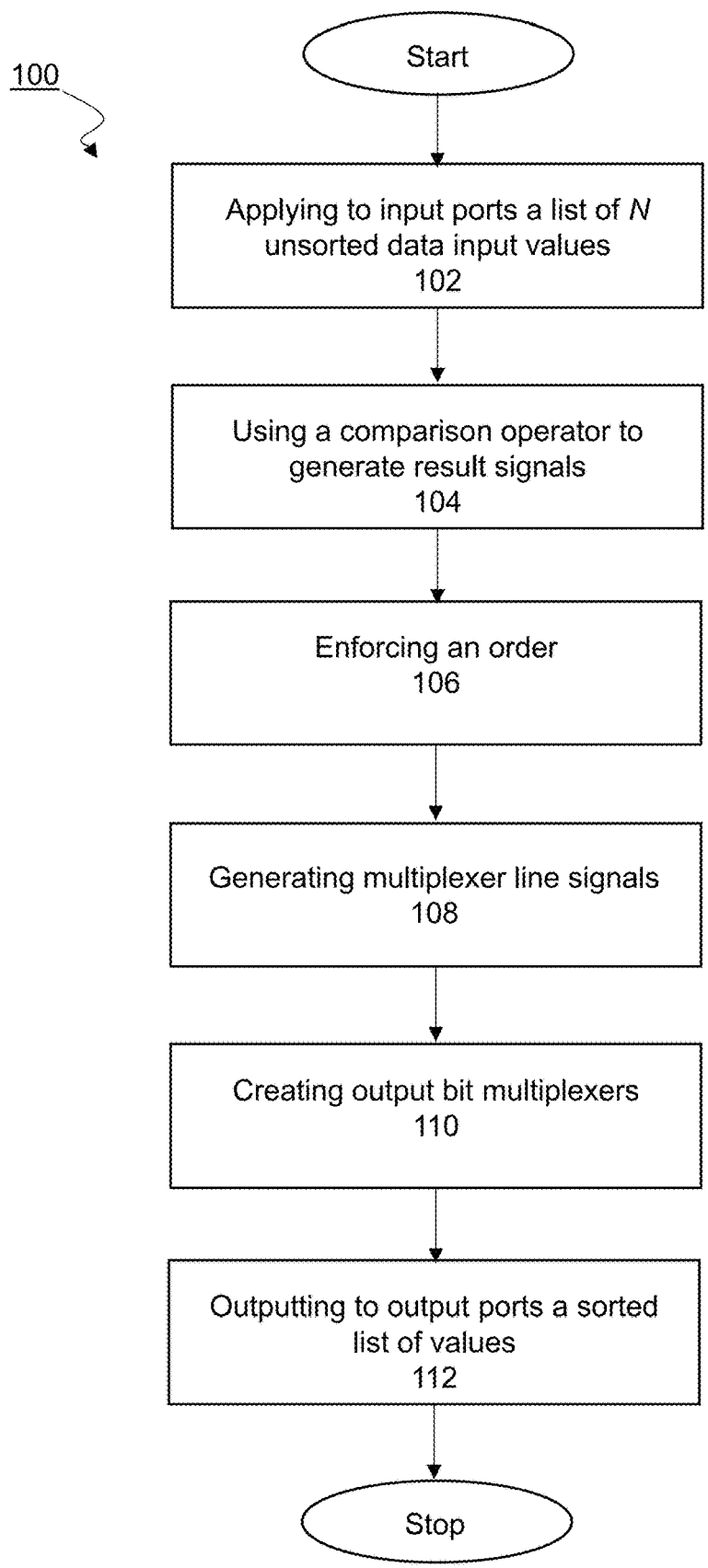
FIG. 7 is a flow chart of a method for designing a single-stage hardware N-sorter or a N-filter.

FIG. 7 is a flow chart of a method 100 for designing a single-stage hardware N-sorter or a N-filter. At step 102 a list of N unsorted data input values is applied to input ports, where N≥4, and each N-sorter or N-filter internal input data value is supplied by an input port.

At step 104, a comparison operator is used to generate, in parallel, all N*(N−1)/2 possible 2-value comparison result signals for the list of N unsorted data input values.

An order is enforced at step 106 for identical input values, in which an input value located higher in the input list is judged to be greater than an identical input value located lower in the input list.

At step 108, multiplexer line signals are generated, each of which, when asserted true, maps an input port value to the correct output port in a sorted output list of values, wherein each multiplexer select line signal is defined by a Sum-Of-Products (SOP) equation. According to certain embodiments, the product terms of the SOP equation select line signal are split into smaller SOP product term equations, which are subsequently ANDed together to implement the full select line equation, wherein the resultant full select lines enable construction of larger N-sorters or N-filters. According to certain embodiments, a single product term in the SOP equation multiplexer line signals of an N-max or N-min filter may be implemented using an AND function of carry chain logic segments.

At step 110, output bit multiplexers are created, which, using the multiplexer select lines, select the correct input port values to be applied to each output bit multiplexer port in the sorted output list of values, and the output multiplexer equation is a ternary equation, which does not include a select line signal that maps input In_0 to the target output.

According to certain embodiments, the ternary output multiplexer equation is replaced by a Sum-Of-Products (SOP) equation, in which each product term comprises an input port value ANDed with the appropriate select line for the selected input and output ports, and wherein the select line signal that maps input In_0 to the target output is included. It is contemplated also that the ternary output bit multiplexer equation or the SOP output bit multiplexer equation may be implemented in the segments of vendor-supplied carry chain logic.

At step 112, a sorted list of values is outputted to output ports, wherein the order of duplicate values in the output list matches the order of those values in the unsorted input list. If all of the values in the sorted output list are mapped to output ports in a hardware device, the device is termed an N-sorter. If a subset of the values in the sorted output list are mapped to output ports in the hardware device, the device is termed an N-filter.

Single-Stage N-Sorter Designs Using Carry Chain Logic

Figure 1:
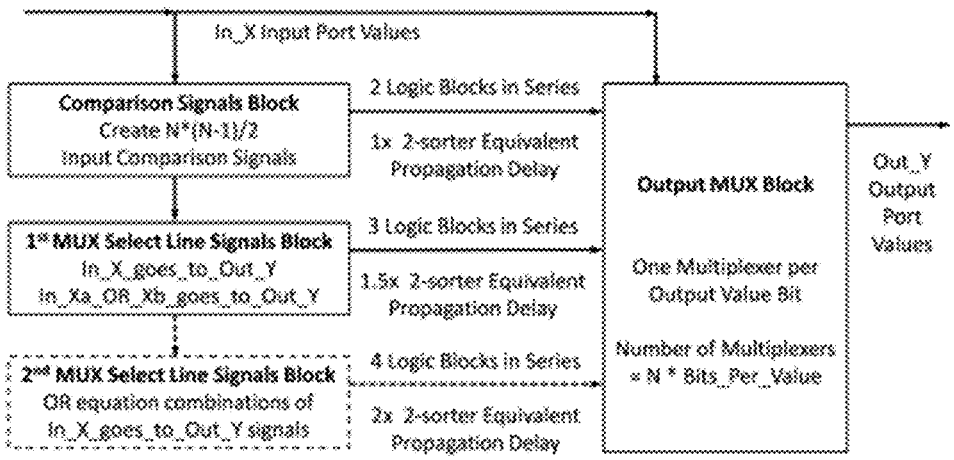
FIG. 1 is a block diagram illustrating a prior art general hardware N-sorter.
Figure 8:
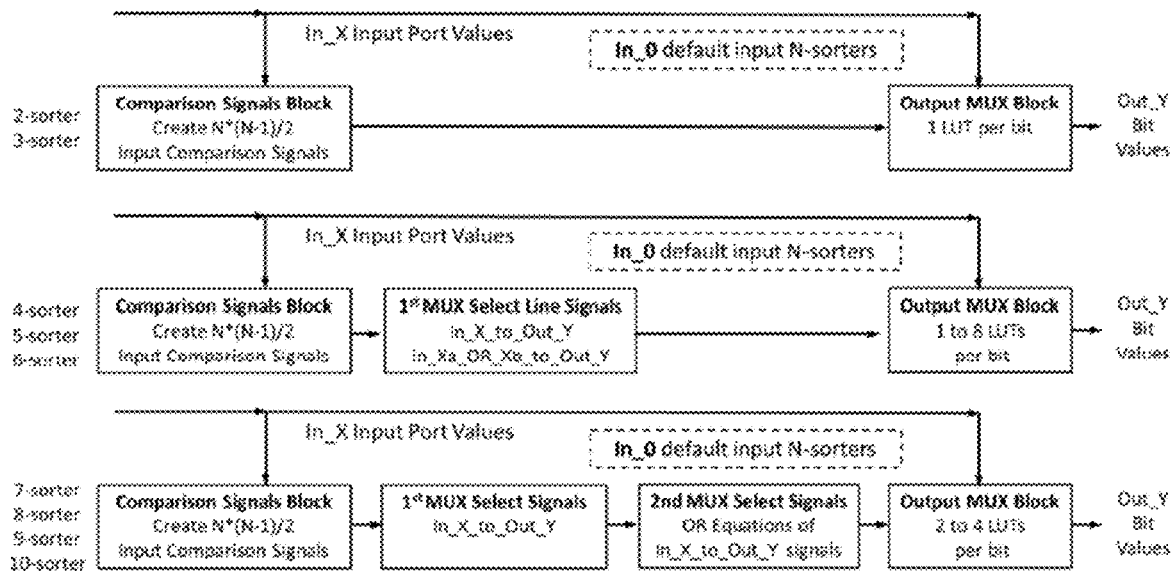
FIG. 8 is a block diagram illustrating prior art LUT-MUXF* baseline N-sorters.

FIG. 8 breaks out the FIG. 1 flow diagram for the previously disclosed N-sorter baseline designs using the LUT-MUXF* LB according to FIG. 2. The top diagram in FIG. 8 shows the flow for the 2-sorter and 3-sorter designs, in which the slowest signals propagate through only 2 logic blocks in series. An output bit multiplexer for each of these sorters is implemented in a single LUT, and the In_X_goes_to_Out_Y signals are also produced in the same output LUT. Neither of these two sorters needs the added functionality provided by the 2-to-1 multiplexers shown in FIG. 2 or the carry chain logic shown in FIG. 4. Therefore, the carry chain logic design methodology disclosed here will target 4-sorters and larger N-sorters, as well as 4- and larger N-filters.

Figure 9:
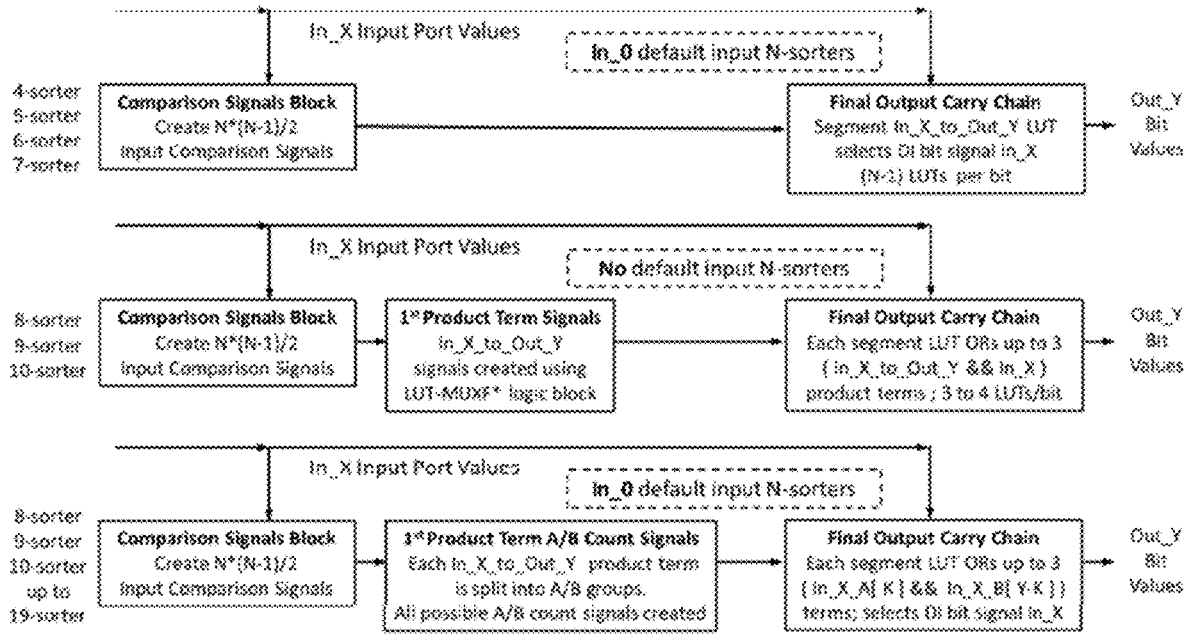
FIG. 9 is a block diagram for LUT-MUXCY Carry Chain N-sorters.

FIG. 9 shows the block flow diagram for the single-stage N-sorter designs disclosed here which use FIG. 4 LUT-MUXCY carry chain logic. The top portion shows that the slowest signals for the new 4-sorter through 7-sorter designs propagate through only 2 LBs in series. The In_X_goes_to_Out_Y signals for these sorters are produced in the output bit multiplexers, like those for the 2-sorters and 3-sorters whose flow is shown at the top of FIG. 8. FIG. 8 also shows that the equivalent baseline LUT-MUXF* 4-sorters to 7-sorters require 3 to 4 logic blocks in series for the slowest signals.

FIG. 10 shows how an 8-segment carry chain block is setup for a 7-sorter's output bit multiplexer, its 2nd and final series logic block. This design also uses the FIG. 5 equation, and the In_0 input bit initializes the chain as the segment [0] CI signal. Each In_X_goes_to_Out_Y SOP equation contains 6 comparison state variables, so each is implemented in a single segment LUT.

If a particular In_X_goes_to_Out_Y signal is true, the corresponding In_X bit is written to the segment CO signal. Otherwise, the segment CI signal is sent to CO. As stated in previous disclosures, a maximum of one In_X_goes_to_Out_Y signal can be true at a given time. If none of the In_X_goes_to_Out_Y signals are true, the default In_0 bit is written by each segment from its CI input to its CO output.

As can be seen in FIG. 4, the LUT output segment S signal writes the DI signal to CO when S is a 0, and sends CI to CO when S is a 1. Because of this, the In_X_goes_to_Out_Y signals must be inverted, as shown in FIG. 10, so that a true In_X_goes_to_Out_Y will write the segment DI to CO.

In FIG. 10 and the subsequent related figures, there is no CI segment input shown, except for segments [0] and [4]. These are the only 2 segments in which a designer can specify what the CI input is. For all other segments, the segment CI input is hard-wired to the CO output of the segment immediately below it.

The LUT-MUXCY 4-, 5-, and 6-sorters are constructed in a similar manner, using (N–1) segments for an N-sorter. Since the 4-sorter and 5-sorter require 4 or fewer segments, the 8-segment chain can be broken up into two 4-segment chains for these sorters, so that 2 output bits can be produced using a single 8-segment chain.

The middle flow diagram in FIG. 9 indicates how one set of carry chain 8-, 9-, and 10-sorters are constructed, using SOP output mux equations like the one shown in FIG. 6. For these sorters, full In_X_goes_to_Out_Y signals are used. They have more than 6 variables, so they cannot be implemented in a single LUT, but they are still constructed in a single FIG. 2 LUT-MUXF* LB, in the 2nd series logic block. In the 3rd and final series logic block, the carry chain output mux block, up to 3 product terms of the output mux SOP equations are implemented per segment LUT.

Each bit of these 8-, 9-, and 10-sorters can be implemented in 4 segments or less, as is shown for the 10-sorter in FIG. 11, so each 8-segment block can produce 2 output bits. Although the FIG. 6 SOP equation does not have a default input, it does have an implicit default logic value of 0, so each SOP output mux chain must have an initial CI[0] value set to 0. If any of the SOP product terms produces a 1, the inverted OR of the 3 product terms for the associated LUT will produce a segment S input of 0, which drives the DI=1 value onto the segment CO output. If none of the product terms is a 1, all segment S inputs will be 1s, and default logic value of 0 will be the bit output value.

Since the FIG. 9 middle diagram N-sorters use full In_X_goes_to_Out_Y signals, the largest N-sorters built with this flow are 10-sorters, as was previously discussed. In the designs using the bottom flow diagram in FIG. 9, the (N–1) comparison state variables in an input's In_X_goes_to_Out_Y product terms are split up into two A/B groups. The A and B group winner count SOP signals are created separately for each input. The count signals are then put into separate A/B arrays, with the array index indicating the winner count for the group. For a given Out_Y, each input's A/B count pair in which the counts add up to Y are ANDed together in a product term of a segment SOP LUT equation. Whenever one of these product terms is a 1, the associated input bit is written to the carry chain for Out_Y.

Once again, this product term splitting allows N-sorters larger than 10-sorters to be constructed. An example of this is a 16-sorter, whose middle outputs require 22 carry chain segments in a cascade of three 8-segment blocks. FIG. 12 shows the setup for the third and final 8-segment block in the 16-sorter's Out_6 bit 0 chain. A full 16-sorter In_X_goes_to_Out_Y product term has a total of 11 comparison state variables, which are split into an A group with 5 variables and a B group with 6 variables. For the 16-sorter Out_6, there are six A/B count pairs which add up to 6, ranging from A[0]/B[6] to A[5]/B[1]. A 6-input LUT can contain 3 pairs, so these 6 pairs require 2 segments per input bit. This 16-sorter uses the FIG. 5 ternary output mux equation, so the full carry chain is initialized in its 1st 8-segment block with the In_0 bit.

As shown in FIG. 13, the A/B group table shows how the input A/B groups are broken out for the middle outputs several N-sorters, up to a 19-sorter. The last three columns refer to the output bit multiplexer product terms. The prior 3 columns refer to the splitting of the In_X_goes_to_Out_Y product terms. It should be clear from the table how the A/B groups for sorters not specifically listed, such as an 18-sorter, can be easily defined.

Product term splitting also allows an alternate set of carry chain 8-, 9-, and 10-sorters to be constructed, using A/B group count signals that are simple LUT outputs. The full In_X_goes_to_Out_Y signals for the comparable N-sorters constructed using the middle FIG. 9 diagram require larger/slower MUXF* blocks, LUT-MUXF7 blocks for an 8-sorter up to LUT-MUXF7/F8/F9 blocks for a 10-sorter. Because of this, these N-sorters may be faster when constructed using the A/B methodology shown in the bottom FIG. 9 flow diagram.

An example of using A/B product term splitting for the 9-sorter's Out_4 median output is shown in FIG. 14. The full 9-sorter In_X_goes_to_Out_Y product terms have N−1=8 comparison state variables, which are split up into A group product terms with 2 variables and B group product terms with 6 variables. The 3 A/B pairs which an input goes to Out_4 are A[0]/B[4], A[1]/B[3], and A[2]/B[2]. As shown in FIG. 14, an input's 3 pairs fit into a single segment 6-input LUT. This design uses the original FIG. 5 output mux equation, with the chain initialized at CI [0] with the In_0 bit, so only a single 8-segment block is needed for a 9-median bit.

Figures 20, 21:
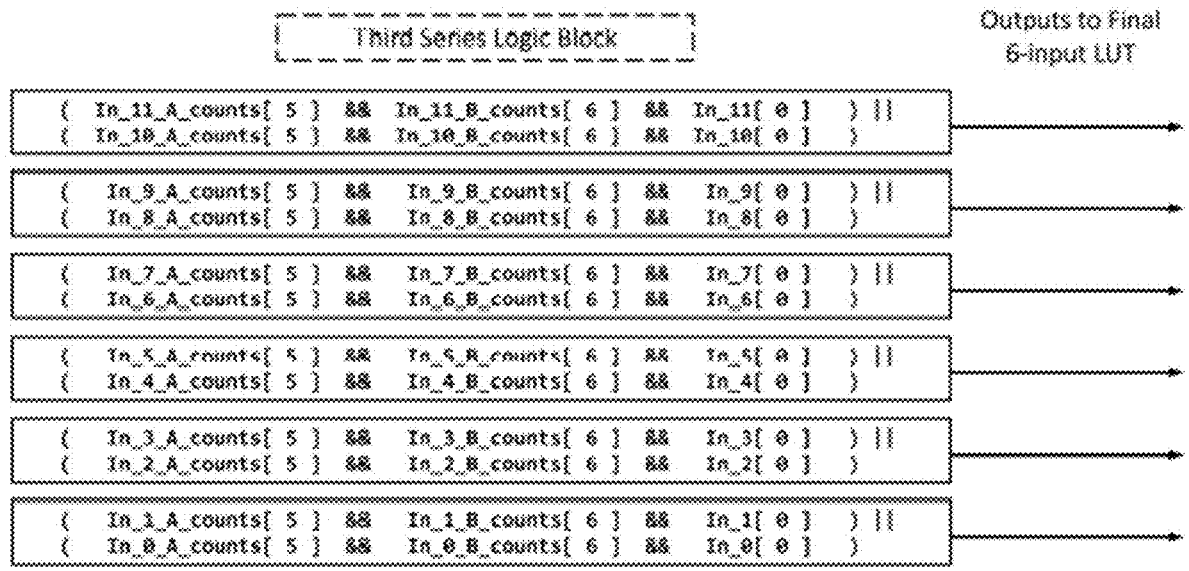
FIG. 20 illustrates the LUT-MUXF* 12-max bit 0 setup using A/B 5/6 groups and the SOP mux equation.
FIG. 21 is a table of the number of series logic blocks, e.g., N-sorters and N-max filters.

The carry chain logic data in the 3rd column of the FIG. 21 summary table shows that the number of series logic blocks for LUT-MUXCY N-sorter designs are always fewer than the number of series logic blocks for the comparable LUT-MUXF* designs, whose data is in the 1st 2 columns. Also, while 10-sorters are the largest LUT-MUXF* N-sorters, the 3rd column of data shows that carry chain logic, combined with In_X_goes_to_Out_Y product term splitting, supports both 12- and 16-sorters. Not shown in the FIG. 21 table, but shown in FIGS. 9 and 13, is the fact that this combination LUT-MUXCY N-sorter design methodology supports N-sorters at least as large as a 19-sorter.

Single-Stage N-Filter Designs Using Carry Chain Logic

N-filters other than N-max and N-min filters are typically based on the associated N-sorter design. Output ports not in the filter output list are eliminated, as well as any internal logic that only supports the eliminated output ports. For example, the 9-sorter Out_4 FIG. 14 is valid whether or not Out_4 is the middle output in a full 9-sorter or the only output in a 9-median filter. When Out_4 is the only output in 9-median filter, the other 8 outputs are, of course, eliminated. Also, for each input, internal B group count LUTs B[0], B[1], B[5], and B[6] are eliminated as well. These B group count signals are needed for various outputs in a full 9-sorter, but as can be seen in FIG. 14, these B count signals are not needed for the single output Out_4.

The N-max and N-min In_X_goes_to_Out_Y SOP equations only have one product term, which enables these filters to be faster than the corresponding full N-sorter. This only-one-product-term feature also allows construction of significantly larger N-max and N-min filters, versus the largest N-sorters that can reasonably be built. Since N-max and N-min filters are essentially designed in the same way, only the design of N-max filters will be discussed further.

Fast carry chain 8-max and larger N-max filters are constructed in a manner similar to that shown in in the bottom flow diagram in FIG. 9, with the full In_X_goes_to_Out_Y product term broken up into 2 or more groups. Although N-sorter middle outputs require up to 10 A/B product terms per input, as shown in the FIG. 13 table, N-max outputs require only 1 product term in which (the maximum) group counts are ANDed together.

FIG. 15 shows the 12-max bit 0 carry chain setup, which uses the new FIG. 6 SOP output mux equation. FIG. 15 shows that only 6 segments in one 8-segment block are needed for each 12-max bit. Each FIG. 15 product term ANDs an input's A[5] and B[6] group counts, along with the associated input bit. Note that only an input's A[5] and B[6] group counts are needed for the 12-max filter.

N-max full In_X_goes_to_Out_Y product terms are also easily split into more than 2 groups. The 25-max design uses 4 A/B/C/D groups, each with 6 comparison state variables. FIG. 16 shows the setup for the 3rd of 3 8-segment blocks for the 25-max bit 0 output mux. This design uses the original FIG. 5 output mux equation, with the In_0 bit used to initialize the carry chain in the 1st 8-segment block, which is not shown.

A 125-max carry chain design is implemented with the slowest signals still propagating through a maximum of 3 logic blocks in series, like all of the carry chain design flows shown in FIG. 9. In the 125-max design disclosed here, each full In_X_goes_to_Out_124 signal, which contains 124 comparison state variables, is constructed in the 2nd series LB, using a chain of 3 LUT-MUXCY blocks. FIG. 17 shows the bottom of the 3 LUT-MUXCY blocks for the In_124_goes_to_Out_124 signal.

This single-stage 125-max design, which can be used for 3-D 5×5×5 video max pooling in a Convolution of Neural Networks (CNN) system, can operate very quickly. According to synthesis results when implemented in a Xilinx Ultrascale+ FPGA, the 125-max design operates in less than 2 nS for 8-bit values. Using this same FPGA hardware, all of the other N-sorter and N-filter designs described here sort their N 8-bit input values in less than 2 nS as well.

The carry chain designs shown in the previous 8-segment figures consist of multiple segments whose CO outputs are OR'd together. These carry chain designs targeted the final output bit muxes in an N-sorter or N-filter design. FIG. 17 shows that carry chain logic can be used to create full In_X_goes_to_Out_Y signals for N-max or N-min designs as well. However, for this task, the carry chain logic segments are ANDed together in order to produce the final In_X_goes_to_Out_Y signal. For example, in the FIG. 17 design, all 8 segment LUT outputs are ANDed together.

When implementing an AND equation, the LUT equation outputs are not inverted. For the output signal to be true, each segment LUT output must be a 1, which ultimately sends the carry chain initialization value of 1 to the output. If one of the LUT outputs is a 0, that output will write a 0 to the carry chain, which cannot be set to 1 by any subsequent segment.

Since each full In_X_goes_to_Out_124 signal has already been produced, the final output mux segment equations are able to include up to 3 input bits, as was shown earlier for the 10-sorter in FIG. 11. While the 10-sorter only required 4 segments per output bit, the 125-max Out_124 bit requires 42 segments in a chain of 6 LUT-MUXCY blocks.

Product term splitting has been emphasized here in the design of carry chain N-max filters larger than a 10-max filter. However, these filters could also be constructed using full In_X_goes_to_Out_Y signals created using carry chains in the 2nd series LB, as was shown for the 125-max filter in FIG. 17. The slowest signals for these alternate N-max filter designs would also propagate through a maximum of 3 logic blocks in series, so both design methodologies would need to be compared in order to determine the optimum design for a particular N-max filter.

As shown here and summarized in the last column in the FIG. 21 table, the slowest signals for LUT-MUXCY N-max filters often traverse fewer logic blocks in series than comparable LUT-MUXF* N-max filters, and much larger LUT-MUXCY N-max filters can be built as well. Single-stage LUT-MUXCY N-max filters larger than a 49-max filter may be feasible. If so, these even larger N-max filters will be constructed using the design principles disclosed here.

LUT-MUXF* N-Sorter and N-Filter Designs Using the SOP Output Mux Equation

As mentioned earlier, the prior art LUT-MUXF* N-sorter baseline designs using the FIG. 8 flow diagrams all used the previously disclosed FIG. 5 output bit ternary mux equation. There are also useful N-sorter and N-filter output mux designs using the FIG. 2 LUT-MUXF* LB and paired with the new FIG. 6 SOP output mux equation. The N-sorter flow diagrams for these new designs are shown in FIG. 18.

Note that in the prior art FIG. 8 LUT-MUXF* flow diagrams, the input signal bits are always output mux inputs to the last logic block in series. In this last LB, LUT-MUXF7 structures are required for the bit muxes of 5-sorters up to 8-sorters, and LUT-MUXF7/F8 structures are required for the bit muxes of 9- and 10-sorters. The FIG. 2 LUT-MUXF* LB does not easily support OR equations larger than an OR-of-6 implemented in a single 6-input LUT. Because of this, FIG. 8 N-sorters larger than a 4-sorter require that ORs of 2 or more In_X_goes_to_Out_Y signals be created prior to the last series LB, to be used as the select lines for the 2-to-1 MUXF* multiplexers in the last stage.

Figure 18:
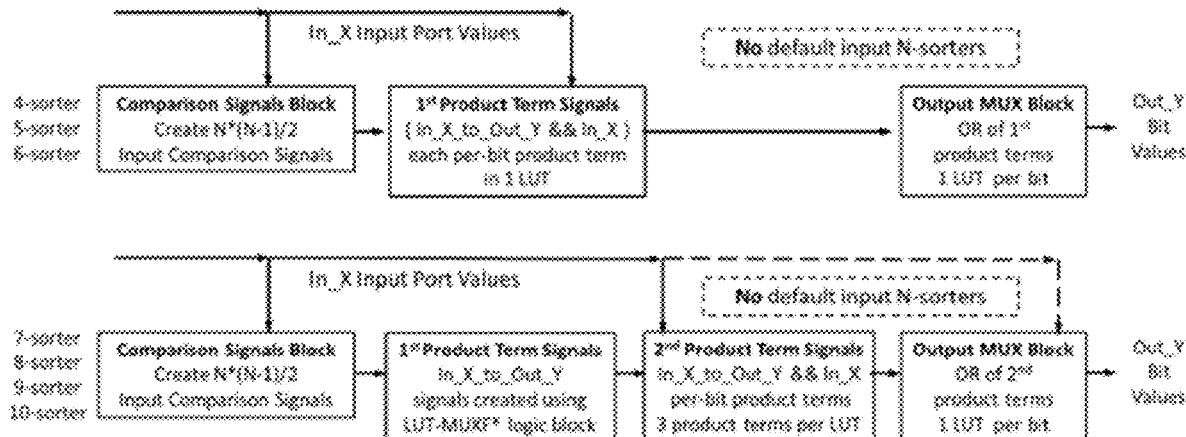
FIG. 18 is a block diagram illustrating LUT-MUXF* N-sorters using the new SOP mux equation.

For the new FIG. 18 designs, the product terms which include the input bits are found in the next-to-the-last LB, and possibly the last LB. The last logic block consists of a single LUT, which typically just ORs the LUT outputs from the next-to-the-last stage. No 2-to-1 MUXF* multiplexers are used in the last stage, so there is no need for any mux selects and therefore no need to OR In_X_goes_to_Out_Y signals.

Figure 19:
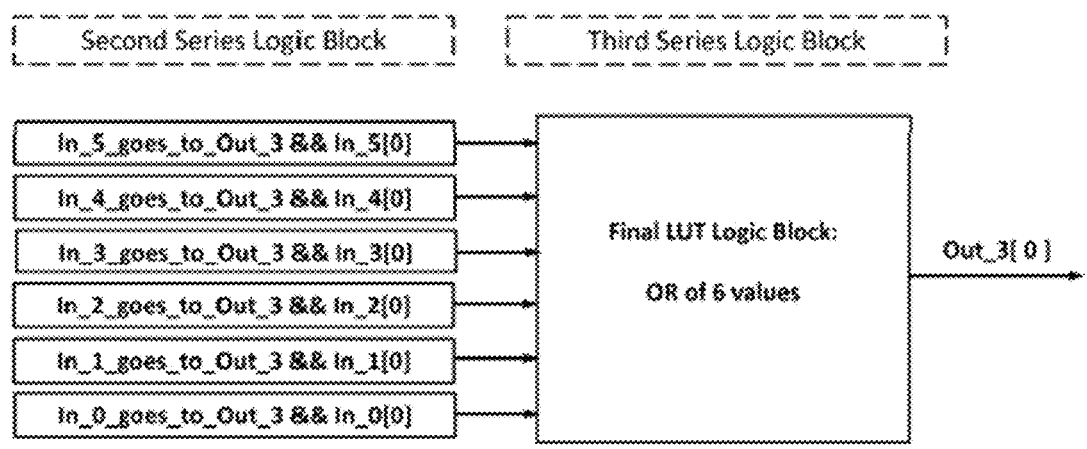
FIG. 19 illustrates the last 2 logic blocks of LUT-MUXF* 6-sorter using the SOP output mux equation.

FIG. 19 shows the last 2 stages of a 6-sorter using the FIG. 18 flow. Each LUT in the next-to-the-last 2nd LB produces one of the 6 SOP product terms. Each 6-sorter In_X_goes_to_Out_Y signal uses 5 comparison state variables, so the In_X_goes_to_Out_Y signal is constructed in the LUT using these 5 variables, and then ANDed with the associated input bit, the 6th LUT input. The 6-input LUT in the 3rd and final LB simply ORs the 6 LUT outputs from the 2nd series LB.

The slowest signals for this 6-sorter propagate through 3 logic blocks in series, which is also true for prior art LUT-MUXF* 6-sorters using the FIG. 8 flow. However, the slowest signals for the prior art LUT-MUXF* 6-sorters propagate through 2-to-1 muxes in the last stage LB and, depending on the design, the 2nd stage LB as well. The slowest signals for the new FIG. 19 design propagate through only LUTs in the last 2 blocks, which enables this new 6-sorter to be faster than the prior art LUT-MUXF* 6-sorter.

As shown in the 1st two columns in the FIG. 21 table, the number of series logic blocks for each of the new LUT-MUXF* N-sorters are no better than those for the associated prior art LUT-MUXF* N-sorter. What is improved for several of the new LUT-MUXF* N-sorters are the paths inside one or more of the LBs.

FIG. 20 shows the 6-LUT setup for the 3rd of 4 series logic blocks in a LUT-MUXF* 12-max design using the FIG. 6 SOP output mux equation. Once again, but not shown, the 4th and final series LB consists of a single 6-input LUT which ORs the signals from this 3rd LB. The flow for the 12-max design is like the bottom flow diagram in FIG. 18, except that the 2nd series LB is the one shown in the bottom diagram in FIG. 9, since this design uses A/B group product term splitting. The largest prior art LUT-MUXF* N-max design is a 10-max filter, so there is no prior art LUT-MUXF* 12-max design to compare to.

Note that FIGS. 15 and 20 both target the bit 0 output mux of a 12-max filter, using essentially the same equations. The FIG. 15 carry chain output mux is implemented in one LUT-MUXCY block, but the FIG. 20 LUT-MUXF* implementation requires two LBs in series.

The data in the 1st two FIG. 21 N-max Filter columns shows that the number of series logic blocks for the new LUT-MUXF* N-max filters are once again no better than those for the prior art LUT-MUXF* N-max filters. However, product term splitting enables the new LUT-MUXF* N-max filter design system to produce larger filters than what were possible with the prior art design system.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

The invention claimed is:

1. A method for designing a single-stage hardware N-sorter or a N-filter, the method comprising steps of:
    applying to input ports a list of N unsorted data input values, where N≥4, and each N-sorter or N-filter internal input data value is supplied by an input port;
    using a comparison operator to generate, in parallel, all N*(N−1)/2 possible 2-value comparison result signals for the list of N unsorted data input values;

enforcing an order for identical input values, in which an input value located higher in the input list is judged to be greater than an identical input value located lower in the input list;

generating multiplexer line signals, each of which, when asserted true, maps an input port value to the correct output port in a sorted output list of values, wherein each multiplexer select line signal is defined by a Sum-Of-Products (SOP) equation, creating output bit multiplexers, which, using the multiplexer select lines, select the correct input port values to be applied to each output bit multiplexer port in the sorted output list of values, and wherein an output multiplexer equation is a ternary equation, which does not include a select line signal that maps input In_0 to a target output, outputting to output ports a sorted list of values, wherein the order of duplicate values in the output list matches the order of those values in the unsorted input list, wherein, if all of the values in the sorted output list are mapped to output ports in a hardware device, the device is termed an N-sorter, or if only a subset of the values in the sorted output list are mapped to output ports in the hardware device, the device is termed an N-filter.

2. The method according to claim 1, wherein the ternary output multiplexer equation is replaced by the Sum-Of-Products (SOP) equation, in which each product term comprises an input port value ANDed with the appropriate select line for the selected input and output ports, and wherein the select line signal that maps input In_0 to the target output is included.

3. The method according to claim 2, wherein the select line SOP equation product terms are split into smaller SOP product term equations, which are subsequently ANDed together to implement the large select line equation, and the resultant select lines enable construction of larger N-sorters.

4. The method according to claim 3, wherein the N-filter device is a 12-max filter.

5. The method according to claim 3, wherein the SOP output bit multiplexer equation is implemented in the segments of vendor-supplied carry chain logic, and wherein the input-to-output signals travel through a maximum of 3 logic blocks in series.

6. The method according to claim 5, wherein the N-filter is a 12-max filter.

7. The method according to claim 1, wherein the N-sorter is a 6-sorter.

8. The method according to claim 2, wherein the SOP output bit multiplexer equation is implemented in the segments of vendor-supplied carry chain logic, and wherein the input-to-output signal paths travel through a maximum of 3 logic blocks in series.

9. The method according to claim 8, wherein the N-sorter is a 10-sorter.

10. The method according to claim 8, wherein the single product term in the SOP equation multiplexer line signals of an N-max or N-min filter is implemented using an AND function of carry chain logic segments.

11. The method according to claim 10, wherein the N-filter is a 125-max filter.

12. The method according to claim 1, wherein product terms of the SOP equation select line signal are split into smaller SOP product term equations, which are subsequently ANDed together to implement the full select line equation, wherein the resultant full select lines enable construction of larger N-sorters or N-filters.

13. The method according to claim 12, wherein the ternary output bit multiplexer equation is implemented in the segments of vendor-supplied carry chain logic, and wherein the input-to-output signals travel through a maximum of 3 logic blocks in series.

14. The method according to claim 13, wherein the N-sorter is a 16-sorter.

15. The method according to claim 13, wherein the N-filter is a 9-median filter or a 25-max filter.

16. The method according to claim 1, wherein the ternary output bit multiplexer equation is implemented in the segments of vendor-supplied carry chain logic, and wherein the input-to-output signals travel through a maximum of 3 logic blocks in series.

17. The method according to claim 16, wherein the N-sorter is a 7-sorter, and wherein the input-to-output signals travel through only 2 logic blocks in series.

18. A method for designing a single-stage hardware N-sorter or a N-filter, the method comprising the steps of:

applying to input ports a list of N unsorted data input values, where $N \geq 4$, and each N-sorter or N-filter internal input data value is supplied by an input port;

using a comparison operator to generate, in parallel, all $N*(N-1)/2$ possible 2-value comparison result signals for the list of N unsorted data input values;

enforcing an order for identical input values, in which an input value located higher in the input list is judged to be greater than an identical input value located lower in the input list;

generating multiplexer line signals, each of which, when asserted true, maps an input port value to the correct output port in a sorted output list of values, wherein each multiplexer select line signal is defined by a Sum-Of-Products (SOP) equation, creating output bit multiplexers, which, using the multiplexer select lines, select the correct input port values to be applied to each output bit multiplexer port in the sorted output list of values, and wherein an output multiplexer equation is a ternary equation, which does not include a select line signal that maps input In_0 to the target output, wherein the ternary equation is implemented in the segments of vendor-supplied carry chain logic, outputting to output ports a sorted list of values, wherein the order of duplicate values in the output list matches the order of those values in the unsorted input list, wherein, if all of the values in the sorted output list are mapped to output ports in a hardware device, the device is termed an N-sorter, or if only a subset of the values in the sorted output list are mapped to output ports in the hardware device, the device is termed an N-filter.

19. A method for designing a single-stage hardware N-sorter or a N-filter, the method comprising the steps of:

applying to input ports a list of N unsorted data input values, where $N \geq 4$, and each N-sorter or N-filter internal input data value is supplied by an input port;

using a comparison operator to generate, in parallel, all $N*(N-1)/2$ possible 2-value comparison result signals for the list of N unsorted data input values;

enforcing an order for identical input values, in which an input value located higher in the input list is judged to be greater than an identical input value located lower in the input list;

generating multiplexer line signals, each of which, when asserted true, maps an input port value to the correct output port in a sorted output list of values, wherein each multiplexer select line signal is defined by the Sum-Of-Products (SOP) equation, creating output bit multiplexers, which, using the multiplexer select lines, select the correct input port values to be applied to each output bit multiplexer port in the sorted output list of values, and wherein an output multiplexer equation is a Sum-Of-Products (SOP) equation which includes the select line signal that maps input In_0 to the target output, outputting to output ports a sorted list of values, wherein the order of duplicate values in the output list matches the order of those values in the unsorted input list, wherein, if all of the values in the sorted output list are mapped to output ports in a hardware device, the device is termed an N-sorter, or if only a subset of the values in the sorted output list are mapped to output ports in the hardware device, the device is termed an N-filter.

20. The method according to claim 19, wherein each product term comprises an input port value ANDed with the appropriate select line for the selected input and output ports, and the select line signal is included in product terms of the SOP equation.

\* \* \* \* \*